United States Patent [19]

Wilson

[11] Patent Number: 5,793,817
[45] Date of Patent: Aug. 11, 1998

[54] DC OFFSET REDUCTION IN A TRANSMITTER

[75] Inventor: John F. Wilson, Great Shelford, England

[73] Assignee: U.S. Philips Corporation, New York, N.Y.

[21] Appl. No.: 735,629

[22] Filed: Oct. 23, 1996

[30] Foreign Application Priority Data

Oct. 24, 1995 [GB] United Kingdom ............ 9521769.1

[51] Int. Cl.$^6$ .................................................. H03C 3/08
[52] U.S. Cl. .......................... 375/297; 455/115; 455/126; 330/107
[58] Field of Search ................... 330/2, 51, 107, 330/109, 149, 129, 296; 455/75, 102, 113–115, 118, 119, 126, 127; 375/271, 278, 279, 284, 285, 295–297, 298, 302, 317–319; 332/103, 107

[56] References Cited

U.S. PATENT DOCUMENTS

| | | | |
|---|---|---|---|
| 5,012,208 | 4/1991 | Makinen et al. | 332/103 |
| 5,396,196 | 3/1995 | Blodgett | 332/103 |
| 5,574,994 | 11/1996 | Huang et al. | 455/126 |
| 5,584,059 | 12/1996 | Turney et al. | 455/126 |
| 5,623,226 | 4/1997 | Whitmarsh et al. | 330/2 |

*Primary Examiner*—Don N. Vo
*Assistant Examiner*—Amanda T. Le
*Attorney, Agent, or Firm*—Dicran Halajian

[57] ABSTRACT

A transmitter comprising at least first and second phase related signal paths, respective frequency up-converters, a combiner for combining the output of the respective frequency up-converters and for supplying the combined signal to a power amplifier. A feedback loop is provided which has a coupler for deriving a portion of the power amplifier output signal and supplying it to first and second phase related feedback paths. Each of the feedback paths comprises frequency down-converters. The dc offset is measured at the respective inputs of the frequency up-converters when the feedback around the linearization loop is reduced to zero without altering the dc offsets produced at the outputs of the frequency down-converters. Subtractors subtract the measured dc offsets from the feedback loop error signals.

6 Claims, 4 Drawing Sheets

DC OFFSET REDUCTION IN A TRANSMITTER

BACKGROUND OF THE INVENTION

The present invention relates to a transmitter and particularly, but not exclusively, to carrier suppression in a transmitter.

A typical transmitter for digital signals normally comprises means for generating baseband signals in quadrature the outputs from which are applied to digital to analogue converters. The analogue signals are low pass filtered and the output signals are applied to frequency up-converters to which quadrature related local oscillator frequency signals are applied. The outputs of the up-converters are combined and applied to a power amplifier to which a load, for example an antenna, is connected. In order to reduce feedthrough of the carrier frequency component from the local oscillator to the mixer outputs to less than a specified minimum level, well balanced mixers and a careful physical layout of the components has to be employed.

Carrier feedthrough is also caused by a dc offset voltage on the input of either or both of the quadrature related mixers. This dc offset voltage can be an inherent part of the input signal or caused by any components used in the processing of the analogue base band signals such as digital to analogue converters or operational amplifiers. The dc offsets in the signal path cannot usually be removed by means of dc block capacitors as these would also block the dc content of the wanted signals which is often crucial to the system performance.

A known method for nulling out dc offsets at the inputs to the mixers normally measures the dc offsets at the mixer inputs or other suitable position in the circuit before the mixers, the offset voltages are then fed back in the appropriate phase to an earlier point in the circuit with amplification if necessary, to form a negative feedback circuit that reduces the offsets and ensures that they meet an appropriately low specification.

U.S. Pat. No. 5,012,208 discloses a quadrature modulator having compensation for local oscillator leakage in which different compensation voltages are added to the I and Q modulation signals. The modulator comprises a feedback loop in which a portion of the output voltage is applied to a power measuring circuit which provides as an output a voltage proportional to the amplitude of the modulated output signal. Any direct current voltage present is blocked by a high pass filter so that an alternating current component of the feedback voltage remains. This feedback voltage is correlated with the I and Q modulation signals, respectively, and the output from each correlation is integrated over a period of time in a respective filter in order to remove any rapidly changing amplitude variations and the resulting compensation voltage is combined with, that is added or subtracted, its respective modulation signal and the results are applied to a final modulator. Each compensation voltage is thus regulated irrespective of the other on the basis of the correlation between the modulating signal corresponding to each compensation voltage and the feedback signal. This known technique in effect creates a correction loop incorporating the power amplifier.

FIG. 1 of the accompanying drawings is a block schematic diagram of a basic frequency up-converter or linear transmitter with an analogue dc nuller. The transmitter comprises a digital quadrature related modulator and associated filtering represented by the block 10. The I, Q outputs from the block 10 are applied to respective digital to analogue converters 12, 14, the outputs of which are applied to respective low pass filters 16, 18. Non inverting inputs of summing stages 20, 22 are coupled to the low pass filters 16, 18, respectively, and outputs of the differencing stages are applied to quadrature related mixers 28, 30, respectively. A local oscillator 32 generates the output carrier frequency and this is applied to 90° phase shifting means 34 which apply a carrier frequency having the relevant phase to the mixers 28, 30. The outputs of the mixers are combined at a summing node 35 and applied to a driver amplifier 36 which is coupled to an rf power amplifier 38. The output of the power amplifier 38 is connected to a signal propagation means which in FIG. 1 is represented by an antenna 40. In FIG. 1 the measurement of the dc offset at the inputs to the mixers 28, 30 is done with the input signals either inhibited or modified to suit the offset measurement process. Once the measurement has been made the result must be held for a period of time which depends on the requirements of the system in use. In practice the hold period depends on the possible rate of drift of the dc offsets involved and the integrity of the hold mechanism. The hold mechanism can be in the form of a capacitor holding a dc voltage or a digital memory device coupled to the necessary analogue to digital and digital to analogue converters. More specifically in FIG. 1, closing of switches 42, 44 causes the dc offsets at the inputs 24, 26 of the mixers 28, 30 to be applied to respective networks comprising operational amplifiers 50, 52 and capacitors 46, 48 respectively. The effect of doing this is to drive signals around the respective loops until the dc offsets are reduced to zero or minimised. The switches 42, 44 are then opened and the input signal in each branch is restored. The values of dc stored on the capacitors 46, 48 are applied to the inverting inputs of summing stages 20, 22 to subtract the stored dc from the dc offset present in the output from the low pass filters 16, 18. This type of dc nulling can only reduce the carrier feedthrough to that determined by the inherent feedthrough performance of the pair of mixers.

A known type of circuit for improving the linearity of a transmitter is to apply feedback around the frequency up-converter and a known type of feedback is termed Cartesian loop feedback. A basic linear transmitter having Cartesian loop feedback is illustrated in FIG. 2 of the accompanying drawings. In the interests of brevity those parts of the circuit which have already been described with reference to FIG. 1 will not be repeated, the same reference numerals having been applied to corresponding components. A coupler 54 couples out a portion of the rf signal at the output of the power amplifier 38 and applies it to a signal divider 55 which is coupled to inputs of quadrature related mixers 56, 58. The local oscillator 32 is coupled by way of a phase control stage 62 to a phase shifter 60 which applies versions of the carrier signal having a relative phase difference of 90° to the mixers 56, 58 which frequency down-convert the coupled out signal to zero IF signals. After amplification in amplifiers 64, 66 the signals are applied to differencing amplifiers 68, 70 which are connected in the signal paths from the low pass filters 16, 18 to the mixers 28, 30, respectively. The subtraction of the outputs from the amplifiers 64, 66 predistort the analogue signals from the low pass filters 16, 18 which predistorted signals are applied to the mixers 28, 30 of the frequency up-converter.

OBJECTS AND SUMMARY OF THE INVENTION

The problems of carrier suppression and dc offsets are present in the circuit shown in FIG. 2 and it is an object of the present invention to remove both problems.

3

According to a first aspect of the present invention there is provided a transmitter comprising frequency up-converting means for frequency up-converting an input signal to a transmission frequency, power amplifying means coupled to the frequency up-converting means, a feedback loop including means for deriving a portion of the amplitude of the output of the power amplifying means, frequency down-converting means for frequency down-converting the derived portion of the output of the power amplifying means, means for determining the dc offset at the input of the frequency up-converting means, means for subtracting the dc offset from the linearisation loop feedback error signal and for applying the difference signal obtained to the frequency up-converting means.

According to a second aspect of the present invention there is provided a transmitter comprising at least first and second phase related signal paths, each of the first and second paths including frequency up-converting means for frequency up-converting respective input signals to a transmission frequency, means for combining outputs of the respective frequency up-converting means, power amplifying means coupled to the combining means, a feedback loop including means for deriving a portion of the output of the power amplifying means, signal splitting means for dividing the signal derived from the power amplifying means into at least first and second phase related feedback paths, each of the first and second phase related feedback paths comprising frequency down-converting means for frequency down-converting its portion of the derived signal at the transmission frequency, means for determining the dc offsets at the inputs of the respective frequency up-converting means and means for subtracting the respective dc offset from the respective linearisation loop feedback error signal and for applying the difference signal obtained to the respective frequency up-converting means.

The present invention is based on the realisation that in any negative feedback loop the performance of the loop is only as good as that of the feedback path. Thus the carrier feedthrough of the complete transmitter becomes that of the down-conversion mixers and amplifiers. As the dc nulling now removes the effects of the carrier feedthrough of the down-conversion mixers, the resulting carrier feedthrough of the transmitter, after the nulling operating, is much better than that of the transmitter shown in FIG. 2.

In an embodiment of the present invention the input or inputs to the linearisation loop must be set to zero in the nulling process, for example by interrupting the feedback loop at the rf side of the mixers, without altering the dc offsets produced at the frequency down converting mixer outputs.

The offset measuring loop may be configured to operate in either one of 2 ways. The dc offset at the input of the frequency up-converting means is stored whilst the feedback loop is broken and when the feedback loop is made operative again the stored dc offset value is subtracted from the signal at an earlier stage, prior to the frequency up-converter. Alternatively when the feedback loop is broken, another loop which includes voltage storage device is formed between the input to the frequency up-converter and a point at an earlier stage, prior to the frequency up-converter. The voltage in the another loop is minimised by loop action. The another loop is interrupted by the feedback loop being reclosed with the result that the dc present at the input of the frequency up-converter is frozen.

BRIEF DESCRIPTION OF THE DRAWINGS

The present invention will now be described, by way of example, with reference to the accompanying drawings, wherein:

4

Figure 1:
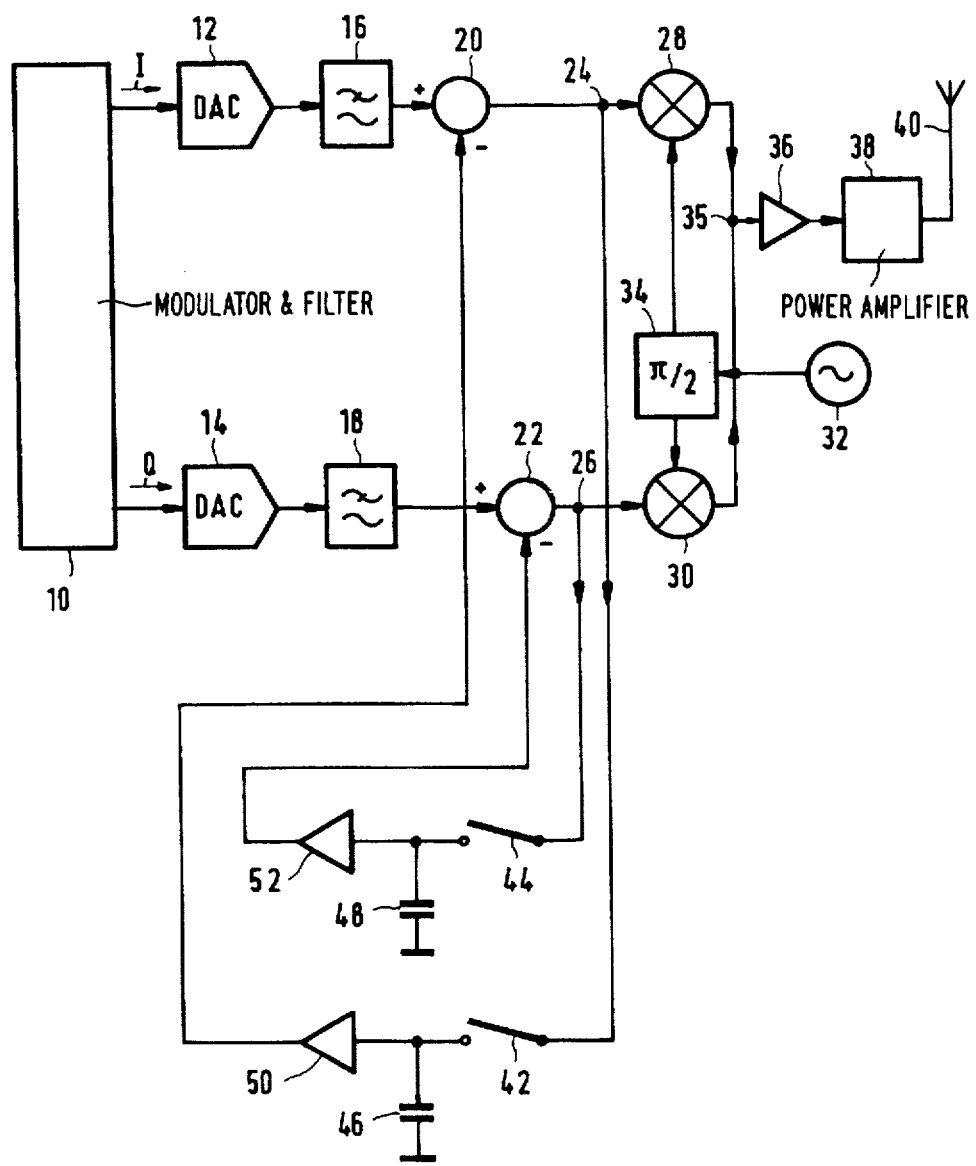
Figure 2:
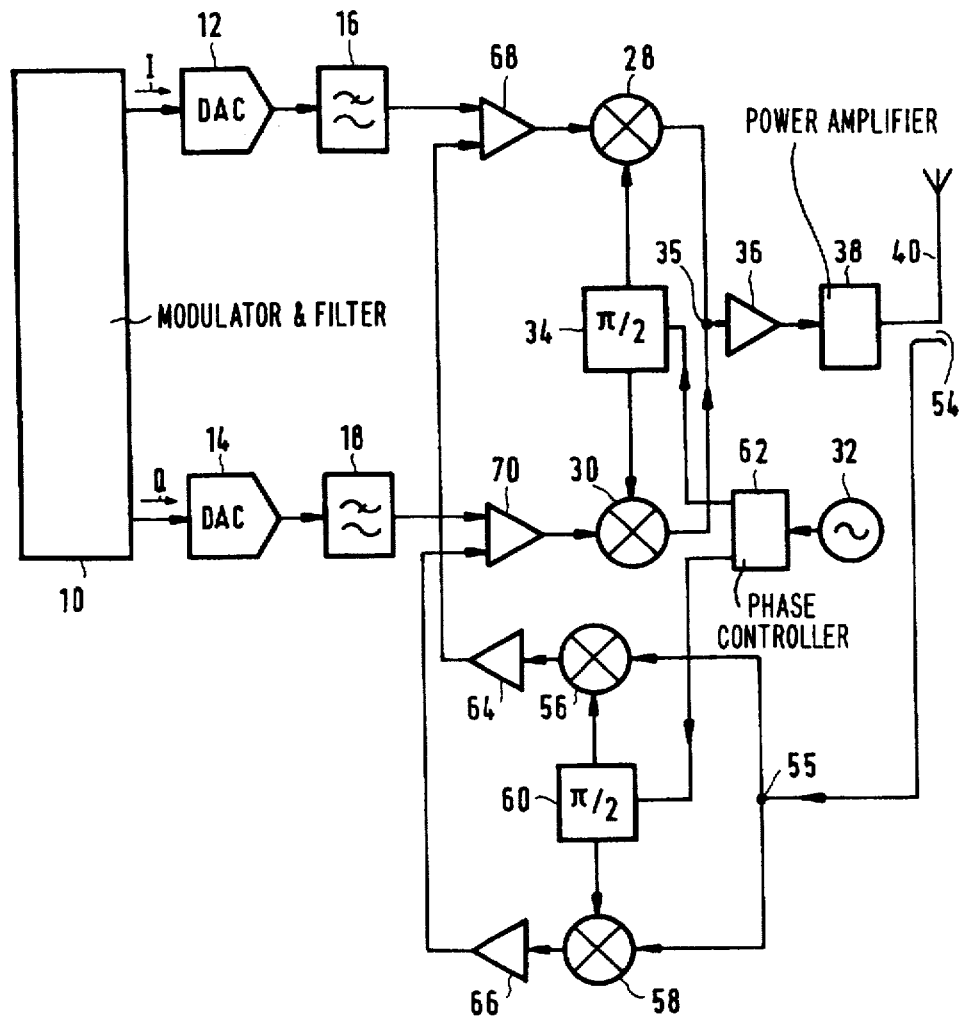
Figure 3:
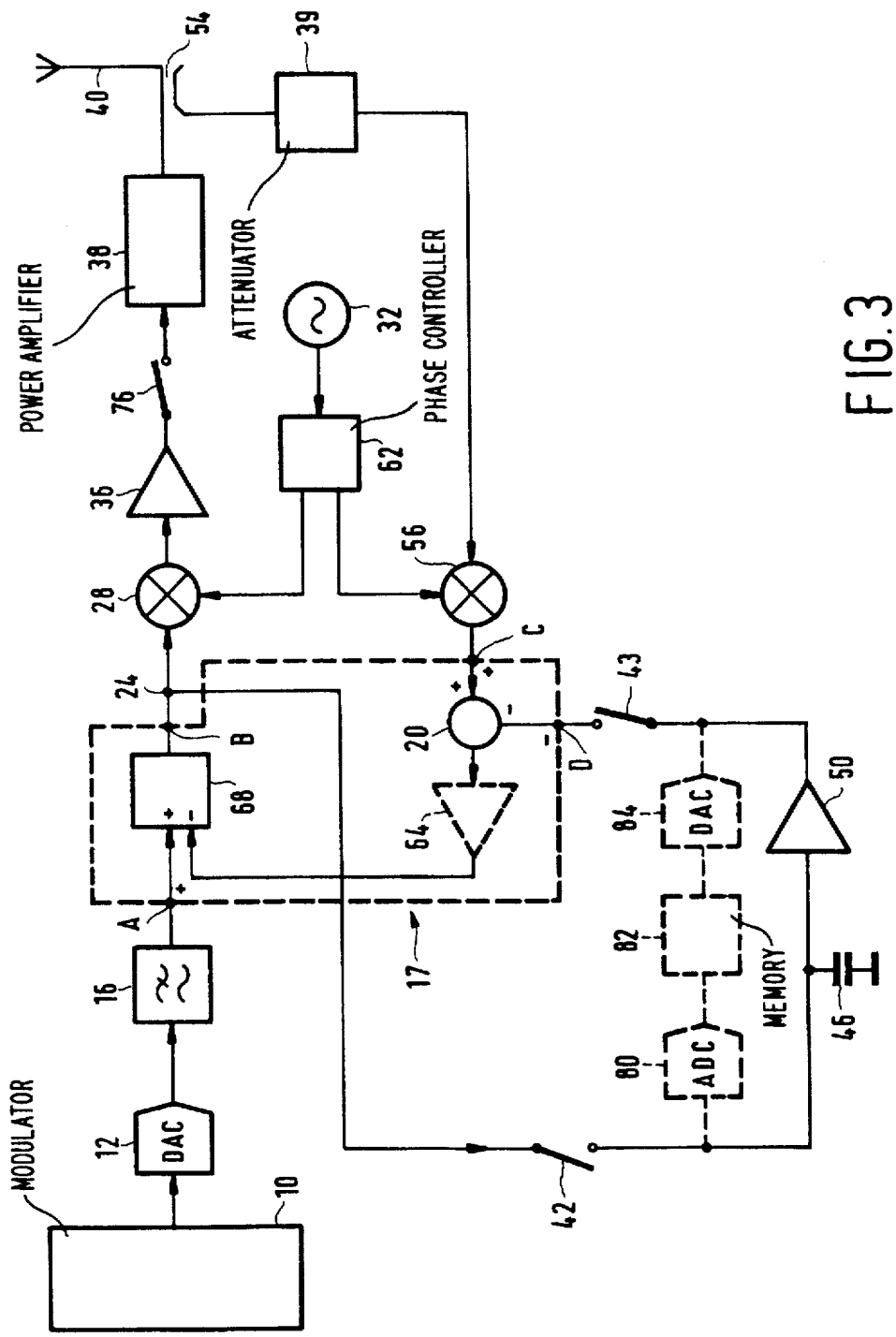
Figure 4:
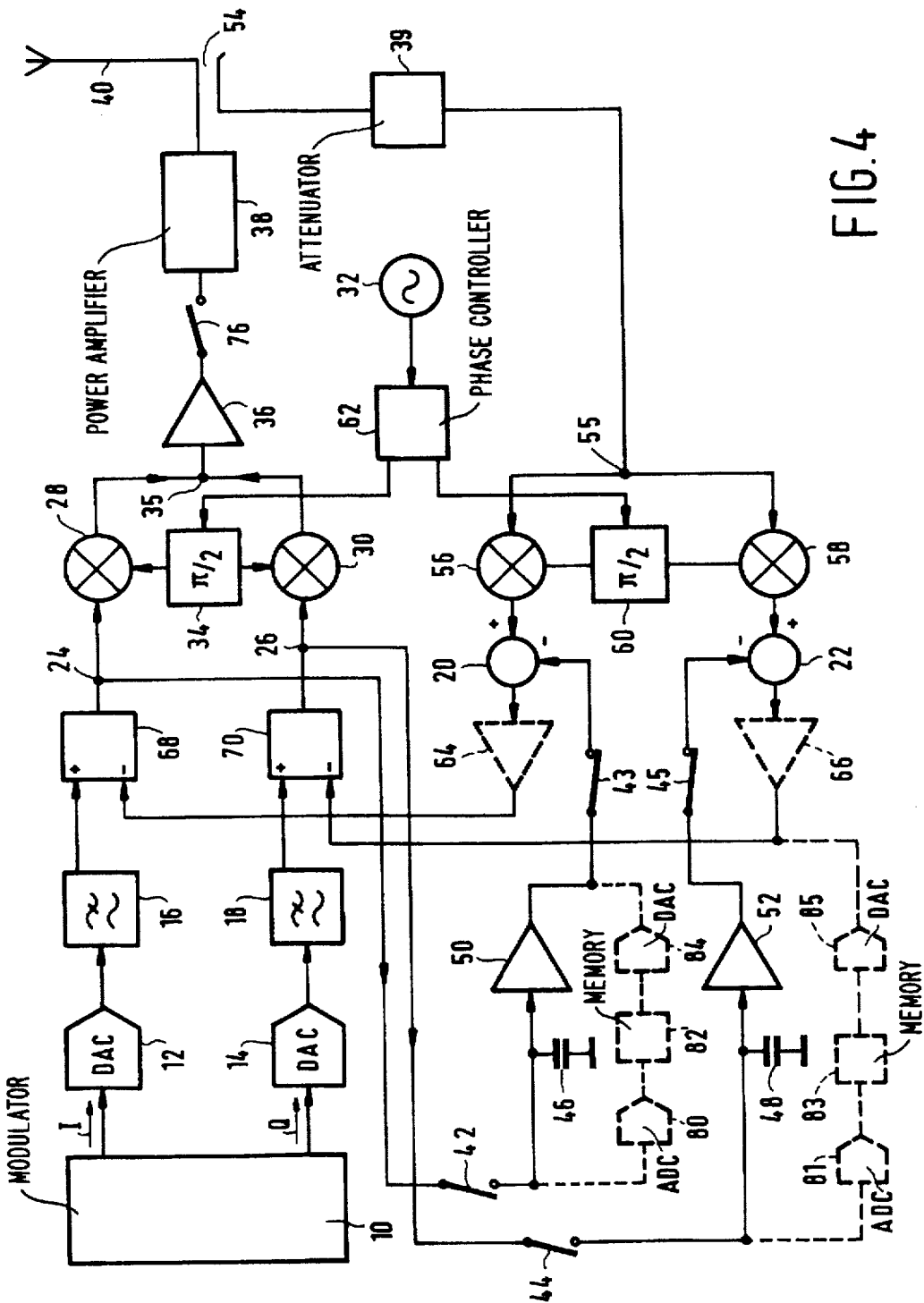

FIG. 1 is block schematic diagram of a known transmitter having dc nulling,

FIG. 2 is a block schematic circuit diagram of a transmitter with Cartesian loop feedback, FIG. 3 is a block schematic diagram of one embodiment of a transmitter made in accordance with the present invention, and FIG. 4 is a block schematic diagram of a second embodiment of a transmitter in accordance with the present invention.

In the drawings the same reference numerals have been used to indicate corresponding features.

DETAILED DESCRIPTION OF THE PREFERRED EMBODIMENTS

The embodiment shown in FIG. 3 shows the basic principle of the invention and operates on the total signal rather than the quadrature related signals. An output from the digital modulator 10 is applied to a digital to analogue (DAC) converter 12. A low pass filter 16 selects the wanted band of signals which are applied to a non-inverting input A of a subtracting stage 17. An output B of the subtracting stage 17 is applied to first input of a mixer 28. A local oscillator 32 which generates the output frequency is coupled via a phase control stage 62 to a second input of the mixer 28. The frequency up-converted output of the mixer 28 is applied to a driver circuit 36, the output from which is coupled by way of a switch 76 to an rf power amplifier 38. An antenna 40 is coupled to the output of the power amplifier 38.

A coupler 54 couples out a portion of the signal being supplied to the antenna and applies it by way of an attenuator 39 to a first input of a frequency down-converting mixer 56, a second input of which is coupled to the phase control stage 62. An output of the mixer 56 is applied to a non-inverting input C of the subtracting stage 17.

The dc voltage present at the input of the mixer 28 is sampled by coupling one side of a switch 42 to a junction 24 in the signal path between the output B of the subtracting stage 17 and the first input of the mixer 28. The other side of the mixer 28 is connected to a dc measuring circuit comprising an amplifier 50 having a capacitor 46 connected between its input and a reference voltage point, such as ground. An output of the amplifier 50 is coupled to an inverting input D of the subtracting stage 17 by way of a switch 43. The subtracting stage 17 may comprise an amplifier having non-inverting inputs A, C, an inverting input D and an output B. In such an arrangement the dc offset is subtracted from the loop error signal. However as shown in FIG. 3, the subtracting stage 17 is implemented as a first differencing stage 68 having a non-inverting input connected to the output of the low pass filter 16, an inverting input coupled to an output of a second differencing stage 20 and an output coupled to the first input of the mixer 28. The second differencing stage 20 has a non-inverting input coupled to the output of the mixer 56 and an inverting input coupled to the output of the amplifier 50. Optionally, an amplifier 64, shown in broken lines, may be connected to the output of the differencing stage 20 to adjust the amplitude to be supplied to the inverting input of the first differencing stage. If the amplifier 64 is provided then it can comprise the second differencing stage.

The operation of the switches 42, 43 and 76 is such that when the switches 43 and 76 are open, the switch 42 is closed and vice versa. When the switches 43 and 76 are closed, as shown, the transmitter is operating normally and a signal is supplied to the antenna 40. The dc offset stored on the capacitor 46 is applied to the input D and is subtracted from the signal at A. In the alternative situation when the switch 42 is closed and the switches 43 and 76 are opened interrupting the voltage applied to the input D and the feedback loop on the rf side of the mixers 28, 56 the d.c offset voltage is measured and is stored on the capacitor 46. When the operation of the switches 42, 43 and 76 is reversed the dc voltage which has been stored is subtracted from the dc offset present in the signal fed back via the mixer 56 in the stage 20 and the difference signal is then applied to the inverting input of the stage 68 in which it is subtracted from the signal passed by the low pass filter 16.

An alternative arrangement for measuring the dc offset present at the junction 24, which arrangement makes use of digital storage, will now be described. The output from the switch 42 is connected to an analogue to digital (ADC) converter 80 which, when the switch 42 is closed provides a digital version of the dc offset present at the junction 24. This digital version is applied to a store 82 which may comprise a RAM or which may comprise a ROM storing pre-determined dc offset values, the digital version constituting a ROM address. Irrespective of how the store 82 is implemented its output is applied to a DAC 84 which provides an analogue dc offset voltage to the differencing stage 20.

The principle of operation of this embodiment of the present invention is that if steps are not taken to compensate for local oscillator feedthrough and dc offsets at the output of the mixer 56, the main feedback loop will compensate for these and reduce them to substantially zero by producing an unwanted carrier signal at the output of the rf amplifier 38. By opening the switch 76 and closing the switch 42, dc offsets are put back into the circuit so that when the switch 76 closes, the re-inserted dc offsets are subtracted from the output signal from the filter 16.

In a variant of FIG. 3, the switch 43 is permanently closed or omitted and the switches 42 and 76 are operated in anti-phase. As a consequence when the switch 42 is closed and the switch 76 is opened a loop is created in which the dc offset at the junction 24 is reduced to zero or minimised by loop action. On reversing the switches 42, 76, the circuit behaves substantially as previously described.

Referring now to the circuit shown in FIG. 4 the I and Q outputs of the digital modulator 10 are applied to respective DACs 12, 14. The corresponding analogue signals are filtered in low pass filters 16, 18, respectively, the outputs of which are applied to non-inverting inputs of first differencing stages 68, 70. The difference outputs from these stages 68, 70 are frequency up-converted in the quadrature related mixers 28, 30. The outputs of the mixers 28, 30 are combined at a summing node 35 and are relayed to a driver amplifier 36. The output of the driver amplifier 36 is coupled by way of a switch 76 to a rf power amplifier 38 which amplifies the signal at the output of the driver amplifier 36 and supplies it to an antenna 40. As will be described in greater detail later, the switch is provided to open the feedback loop when the dc offset voltages at the inputs of the mixers 28, 30 are being measured. A portion of the transmitter signal is coupled out by directional coupler 54 and supplied by way of an attenuator 39 to a signal dividing node 55. The node 55 is connected to quadrature related frequency down-conversion mixers 56, 58, respectively. The outputs of the mixers, 56, 58 are applied to non-inverting inputs of second differencing stages 20, 22.

Signals present at the inputs to the frequency up-conversion mixers 28, 30 are tapped off at junctions 24, 26 and are supplied to respective dc offset sampling circuits comprising switches 42, 44 and respective measuring circuits comprising amplifiers 50, 52 and capacitors 46, 48 and switches 43 and 45. The outputs of the amplifiers 50, 52 are supplied by way of the switches 43, 45 when closed to the respective inverting inputs of second differencing stages 20, 22. The outputs of the second differencing stages 20, 22 are coupled to the inverting inputs of the first differencing stages 68, 70. Optionally amplifiers 64, 66 are coupled the outputs of the second differencing stages 20, 22, respectively. The first and second differencing stages 68, 70 and 20, 22 may be implemented as amplifiers having non-inverting inputs coupled to the outputs of the low pass filter 16, 18 and mixer 20, 22, respectively, and an inverting input coupled to an output of the respective dc measuring circuit.

In operation, the method of carrier suppression and dc offset nulling is based on sampling the dc offsets when the feedback loop is interrupted by opening the switch switches 43, 45 and 76. Simultaneously the switches 42, 44 are closed enabling the offset voltages at the junction 24, 26 to be sampled without altering the dc offsets produced by the mixers 56, 58. Thereafter the operation of these switches 42 and 44 on the one hand and 43, 45 and 76 on the other hand is reversed and when the transmitter is active, the values of the dc offsets stored on the capacitors 46, 48 are subtracted from the dc offsets present in the respective outputs of the frequency down-conversion mixers 56, 58. The outputs of the differencing stages 20, 22, which outputs comprise any residual dc offset together with the analogue signals present at the outputs of the mixers 56, 58 are applied to the inputs of the differencing stages 68, 70. In other words dc offsets at the input of the mixers 28, 30 of the frequency up-converter are removed by the dc nulling loop which applies a correction voltage at an output of the frequency down-conversion mixers 56, 58, which correction voltage can be held after the nulling operation by the capacitors 46, 48 or other suitable memory device in the case of a digital measuring arrangement.

For this system to work correctly the I and Q inputs to the loop must be set to zero and the feedback loop itself must be broken at the rf side of the mixers during the nulling process, for example by opening the switch 76 and in so doing the feedback around the loop is reduced to zero without altering the dc offsets produced at the down-conversion mixer outputs. This process ensures that any dc offsets due to carrier feedthrough in the down conversion mixers are also removed by the dc nulling loop.

The dc offsets measured at the junctions 24, 26 may be stored digitally using ADCs 80, 81, stores 82, 83 and DACs 84, 85.

In FIG. 4 the subtracting means comprising the differencing stages 20, 68 and 22, 70 may be implemented as a single stage as described with reference to FIG. 3.

In a variant of FIG. 4, the switches 43, 45 are omitted so that when the switches 42, 44 are closed and the switch 76 is opened, loops are created in which the dc offset voltages are minimised or reduced to zero. Once the operation of the switches 42, 44 and 76 is reversed, the circuit behaves substantially as described previously.

Although the embodiment of FIG. 4 has been described with reference to quadrature related signals in which the baseband input signals I, Q are separated by 90°, the transmitter may be embodied such that there are any number of baseband inputs each going into its own frequency up-conversion mixer with an equal number of mixers in the frequency down-conversion paths of the feedback loop. In such cases the phase relationship between each input signal and the local oscillator input signal to each mixer is likely to be 180/n° where n is the number of input signals. For example n=4 the phases of the input signals are 0°,45°,90° and 135°.

The dc nulling loop can be used as a method of control of the carrier signal where this is required. In this case the amplitude and phase of the carrier signal can be controlled accurately by adding a controlled dc voltage to the dc nuller input stage 50, 52 in either or both of the rf loops. This will result in carrier signal from the up-converter whose amplitude and phase is directly proportional to the vector sum of the two dc levels on the I and Q inputs of the dc nullers.

The invention may also be applied to other rf feedback circuits such as adaptive predistorting circuits and the magnitude (or envelope) part of a polar loop transmitter.

From reading the present disclosure, other modifications will be apparent to persons skilled in the art. Such modifications may involve other features which are already known in the design, manufacture and use of systems linear transmitters and component parts therefor and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

I claim:

1. A transmitter comprising:

subtracting means having a signal input for receiving an input signal;

frequency-up converting means having an input coupled to said subtracting means;

power amplifier means coupleable to said frequency-up converting means;

feedback loop means for coupling out a portion of an output signal outputted from said power amplifier means;

frequency-down converting means, coupled to said feedback loop means and said subtracting means, for frequency down converting said portion of said output signal;

dc offset determining means having an input coupleable to said input of said frequency-up converting means and an output coupleable to said subtracting means, for determining a dc offset at said input of the frequency-up converting means; and switching means for switching said transmitter between a first mode and a second mode wherein when said transmitter is in said first mode said frequency-up converting means is decoupled from said power amplifier means, said output of said dc offset determining means is decoupled from said subtracting means, and said input of said dc offset determining means is coupled to said input of said frequency-up converting means; and wherein when said transmitter is in said second mode said frequency-up converting means is coupled to said power amplifier means, said output of said dc offset determining means is coupled to said input of said frequency-up converting means, and said input of said dc offset determining means is decoupled from said subtracting means.

2. The transmitter as claimed in claim 1, and including offset voltage producing means, coupleable to said input of said frequency up converting means and said subtracting means, for producing a digital representation of a dc offset voltage.

3. The transmitter as claimed in claim 1, and including offset voltage producing means, coupleable to said input of said frequency up converting means and said subtracting means, for producing an analog representation of a dc offset voltage.

4. A transmitter comprising:

a first frequency up converting means for frequency up converting a respective first input signal and a second frequency up converting means for frequency up converting a respective second input signal;

power amplifier means coupleable to the first and second frequency up converting means;

means for coupling out a portion of an output signal outputted from said power amplifier means and for dividing said signal portion into at least first and second divided signal portions;

first frequency-down converting means for frequency down converting said first divided signal portion and second frequency-down converting means for frequency down converting said second divided signal portion;

first dc offset determining means having an input coupleable to an input of said first frequency-up converting means and second dc offset determining means having an input coupleable to an input of said second frequency-up converting means; said first and second dc offset determining means for respectively determining a dc offset at said input of the first and second frequency-up converting means;

first differencing means having an input coupleable to an output of said first dc offset determining means and second differencing means having an input coupleable to an output of said second dc offset determining means; said first differencing means also being coupled to said input of said first frequency-up converting means and said second differencing means also being coupled to said input of said second frequency-up converting means; and switching means for switching said transmitter between a first mode and a second mode wherein when said transmitter is in said first mode said first and second frequency-up converting means are decoupled from said power amplifier means, said outputs of said first and second dc offset determining means are decoupled from said respective inputs of said first and second differencing means, and said inputs of said first and second dc offset determining means are coupled to said respective inputs of said first and second frequency-up converting means; and wherein when said transmitter is in said second mode said first and second frequency-up converting means are coupled to said power amplifier means, said outputs of said first and second dc offset determining means are coupled to said respective inputs of said first and second differencing means, and said inputs of said first and second dc offset determining means are decoupled from said respective inputs of said first and second first frequency-up converting means.

5. The transmitter as claimed in claim 4, and including first and second offset voltage producing means respectively coupleable to said inputs of said first and second frequency up converting means and said first and second respective differencing means, for producing respective digital representations of a dc offset voltage.

6. The transmitter as claimed in claim 4, and including first and second offset voltage producing means respectively coupleable to said inputs of said first and second frequency up converting means and said first and second respective differencing means, for producing respective analog representations of a dc offset voltage.

\* \* \* \* \*